United States Patent [19]

Castera et al.

[11] 4,314,214

[45] Feb. 2, 1982

[54] MAGNETOSTATIC-WAVE DEVICE COMPRISING A CONDUCTING STRIP EXCHANGE STRUCTURE

[75] Inventors: Jean P. Castera; Pierre Hartemann; Jean M. Dupont, all of Paris, France

[73] Assignee: Thomson-CSF, Paris, France

[21] Appl. No.: 166,698

[22] Filed: Jul. 3, 1980

[30] Foreign Application Priority Data

Jul. 6, 1979 [FR] France .............................. 79 17602

[51] Int. Cl.³ .............................................. H03H 2/00
[52] U.S. Cl. .................................. 333/141; 333/142; 333/148; 333/154
[58] Field of Search ................. 310/26; 333/150–155, 333/193–196, 141–145, 147–149; 365/33–37, 50, 55–58, 69, 87, 90–91, 93

[56] References Cited

U.S. PATENT DOCUMENTS 4,199,737  4/1980  Patterson et al. .............. 310/326 X Primary Examiner—Marvin L. Nussbaum
Attorney, Agent, or Firm—Cushman, Darby & Cushman

[57] ABSTRACT

The invention relates to a magnetostatic-wave device whose ferrimagnetic layer supports an exchange structure formed by an array of conducting strips having their ends connected by conducting bridges. The invention applies particularly to the construction of magnetostatic-wave devices using couplers, hybrid junctions, reflecting mirrors, extraction structures and resonators.

25 Claims, 17 Drawing Figures

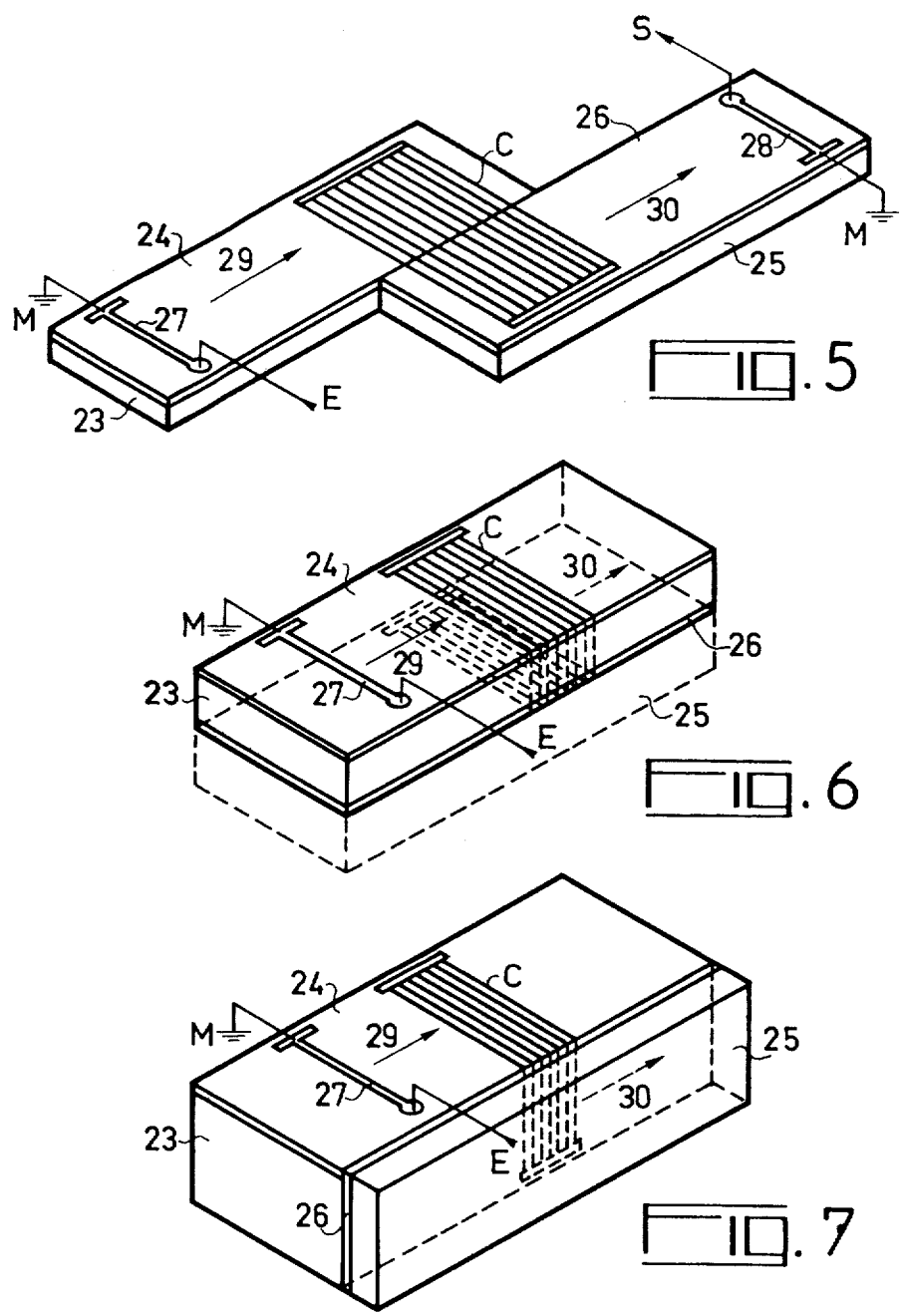

4,314,214

MAGNETOSTATIC-WAVE DEVICE COMPRISING A CONDUCTING STRIP EXCHANGE STRUCTURE

BACKGROUND OF THE INVENTION

The present invention relates to micro-wave devices using the propagation of magnetostatic waves in a ferrimagnetic medium. Starting with a substrate formed for example by a <111> biased gallium and gadolinium garnet (GGG), there can be grown by epitaxy a thin ferrimagnetic layer of yttrium and iron garnet (YIG). This ferrimagnetic layer, whose thickness may vary between a few microns and a few tens of microns, is capable of propagating different types of magnetostatic waves with relatively small losses. Depending on the orientation of the polarizing magnetic field, surface or volume magnetostatic waves can be propagated. The speeds of propagation are substantially higher than those which are met with in surface acoustic wave devices, which facilitate the construction of devices operating at frequencies equal to or greater than gigahertz. Furthermore, the speed of propagation of the magnetostatic waves varies with the intensity of the polarizing magnetic field, which enables tunable devices to be obtained in the filter and resonator field. This interesting property also allows the characteristics of a dispersive or non-dispersive delay line to be adjusted.

In the field of surface acoustic wave devices, exchange structures are known formed from conducting strips insulated from each other. These structures are formed by photo-etching on the surface of a piezoelectric substrate. They act on the sharing of the ultrasonic energy to cause distribution, total transfer, concentration or reflection of this energy.

In the field of magnetostatic-wave devices, transducer structures, selective reflector gratings formed of insulated conducting strips and different absorption means are already known. However, with the use of exchange structures the field of application of magnetostatic waves can be substantially enlarged. Since the mode of manufacture of such exchange means may be the same as that of transducers and reflecting gratings, the configurations which comprise them can be easily achieved by photo-etching a metal film deposited or simply applied to one of the faces of the thin ferrimagnetic wafer along which the magnetostatic waves are propagated.

SUMMARY OF THE INVENTION

The invention provides a magnetostatic-wave device comprising a layer of ferrimagnetic material subjected to a polarizing magnetic field and provided on one of its faces with at least one structure comprising an array of adjacent conducting strips, wherein the ends of these strips are connected electrically; the arrangement of these strips being such that they take on the form of the incident wave fronts over at least a part of their length.

DESCRIPTION OF THE FIGURES

The invention will be better understood from the following description and accompanying figures in which:

FIG. 5 shows an exchange structure establishing coupling between two magnetostatic-wave devices.

FIG. 6 shows a variation of the exchange structure of FIG. 5.

FIG. 7 shows another variation of the exchange structure of FIG. 6.

DESCRIPTION OF THE PREFERRED EMBODIMENTS

Figure 1:
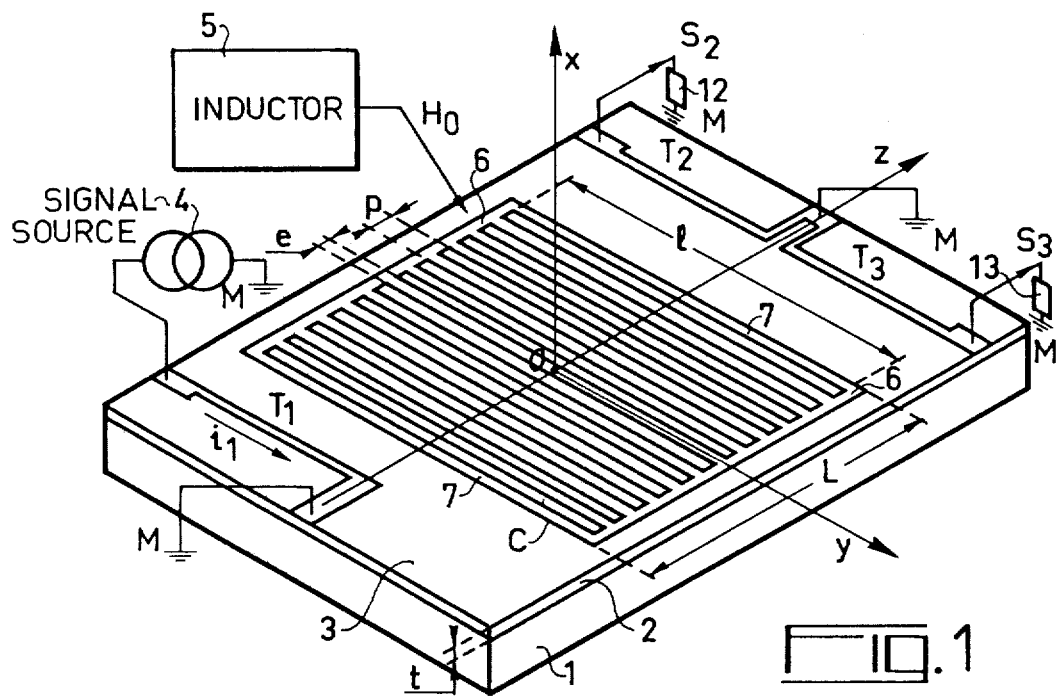
FIG. 1 is an isometric view of a magnetostatic-wave device equipped with an exchange structure in accordance with the invention.

In FIG. 1 there can be seen an isometric view of a magnetostatic-wave device comprising for example a substrate 1 made from gadolinium and gallium garnet (GGG) on the surface of which there has been grown by epitaxy a thin ferrimagnetic layer 2 of yttrium and iron garnet (YIG) whose thickness t is 20 microns. The surface 3 of ferrimagnetic layer 2 merges with the plane yoz of the system of reference axes Oxy. This layer 2 is subjected to a magnetic field $\vec{H}o$ produced by an inductor 5. According to the orientation of field $\vec{H}o$, three sorts of magnetostatic waves can be distinguished.

When the magnetic field $\vec{H}o$ is perpendicular to surface 3, i.e. parallel to axis ox, the layer propagates so-called bulk forward magnetostatic waves.

When the magnetic field Ho is oriented along axis oz, the layer propagates so-called bulk backward magnetostatic waves.

Finally, when the magnetic field $\vec{H}o$ is oriented parallel to axis oy the layer propagates so-called surface magnetostatic waves; these waves being non-reciprocal, the propagation takes place in the direction of the vectorial product $\vec{H}o \times \vec{n}$ where $\vec{n}$ is the perpendicular to the outwardly directed surface.

In the rest of the description, any of the wave types may be envisaged.

In the case of FIG. 1, we may for example assume that we are in the presence of surface magnetostatic waves emitted by a transducer $T_1$ and which are propagated in the direction oz when the field $\vec{H}o$ is oriented in a direction opposite axis oy. Transducer $T_1$ comprises a rectilinear conducting element through which passes a current $i_1$ parallel to axis oy. This energizing current $i_1$ is delivered by a micro-wave generator 4 coupled to the ends of transducer $T_1$.

Transducers $T_2$ and $T_3$ are arranged opposite layer 2 so as to convert the incident magnetostatic waves into electrical signals $S_2$ and $S_3$ which appear at the terminals of load impedances 12 and 13. Transducers $T_1$ and $T_2$ are arranged face to face so that the magnetostatic waves may be directly exchanged in the absence of any other means. Transducer $T_3$ is offset so as to collect the magnetostatic waves whose path has been modified by the insertion of exchange device C.

The exchange device C is formed by an array of conducting strips 7 forming on the surface 3 of ferrimagnetic layer 2 an arrangement of conductors aligned in accordance with the wave fronts from transducer $T_1$. This array of conductors has a width 1 substantially double the width of transducer $T_1$. The array has a length L in the direction of propagation of the magnetostatic waves. At each lateral edge of the array, conductors 7 are interconnected by means of conducting strips 6. The width of conductors 7 is equal to e whereas their pitch is equal to p. It should be noted that the pitch p is chosen so as not to correspond to a multiple of the half-wavelength so that the elementary reflections produced by the conducting strips 7 may be in phase concordance. In fact, the array of strips 7 must in no wise form a reflecting grating. The existence of conducting strips also implies that e is less than p, since in accordance with the invention, it is arranged for the currents induced in the array to be channeled, which would not be the case if this latter were formed by a conducting layer completely covering surface 3 in a rectangular area of dimensions $1 \times L$.

In the case of FIG. 1, the energization of exchange device C by the magnetostatic waves generated by transducer $T_1$ is characterized by an incident wave front parallel to oy along which the distribution of the amplitudes assumes the form of a rectangular function having a unit value for the coordinate points $y < 0$ and a zero value for coordinate points $y > 0$. This distribution may be considered as the algebraic sum of two amplitude distributions corresponding to symmetric and antisymmetric energization modes, which may pass through exchange structure C with different phase velocities.

Figure 2:
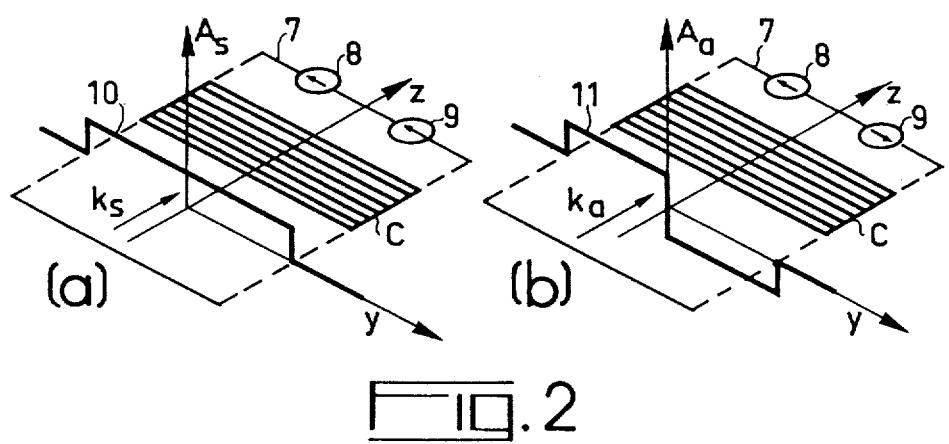
FIG. 2 shows at (a) and (b) the break-up into symmetric and asymmetric modes of a wave front passing through the exchange structure of FIG. 1.

In FIG. 2 there is shown at (a) the energization of exchange structure C by a magnetostatic wave having $k_s$ as wave number and characterized by a distribution 10 of amplitudes $A_s$ uniform from one edge to the other of the exchange structure. Such a wave is propagated in accordance with a symmetric mode such that the electromotive forces 8 and 9 induced in the two halves of a conducting strip 7 are added together. The result is an induced current flowing along a loop formed by each conducting strip 7 and the assembly of its neighbors. Of course, the induced current may also be looped by a ground conductor which surrounds the support of the exchange structure. In this case, all the ends of the strips are interconnected by this ground conductor. This ground conductor will be advantageously formed by a surrounding metal deposit. The conditions at the limits imposed on interface 3 by the presence of induced currents oriented along the strips of exchange structure C results in propagation properties which seem little different from the one met within the non-covered areas of surface 1. Physically everything seems to happen as if the symmetrical mode cannot "see" the conducting strips 7. However that may be, the deviation between $k_s$ and $k_s$ proves substantially equal to the deviation between the wave numbers corresponding respectively to a bared ferrimagnetic layer and to a ferrimagnetic layer completely covered with metal.

FIG. 2 shows at (b) the energization of the same exchange structure C by means of a magnetostatic wave having $k_a$ as wave number and characterized by a distribution 11 of amplitudes $A_a$ whose sign is reversed at coordinate point $y = 0$. The antisymmetric propagation mode associated with this distribution tends to induce in the two halves of each conducting strip 7 electromotive forces 8 and 9 which are equal and of opposite signs. The result is that no induced current flows along conducting strips 7 so that the structure influences the propagation as would a continuous conducting layer. The boundary conditions applying to this type of situation result in propagation properties fairly different from those met with in the uncovered areas of surface 3.

In what has gone before it can be seen that the symmetric and antisymmetric modes are propagated along axis z with distinct phase velocities. The wave numbers $k_s$ and $k_a$ are different from each other, which gives rise to interference phenomena between the two propagated modes. These interference phenomena may appear in the form of a propagation having for wave number $k = (k_a + k_s/2)$ on introducing a differential phase shift between the propagated waves on each side of axis z. This differential phase shift $\Delta\phi$ is expressed by the relationship:

$$\Delta\phi = 2 \, L \cdot K$$

where K is a coupling constant whose value is given by:

$$K = (k_a - k_s/2)$$

L is the distance traveled in the direction of axis z.

Figure 3:
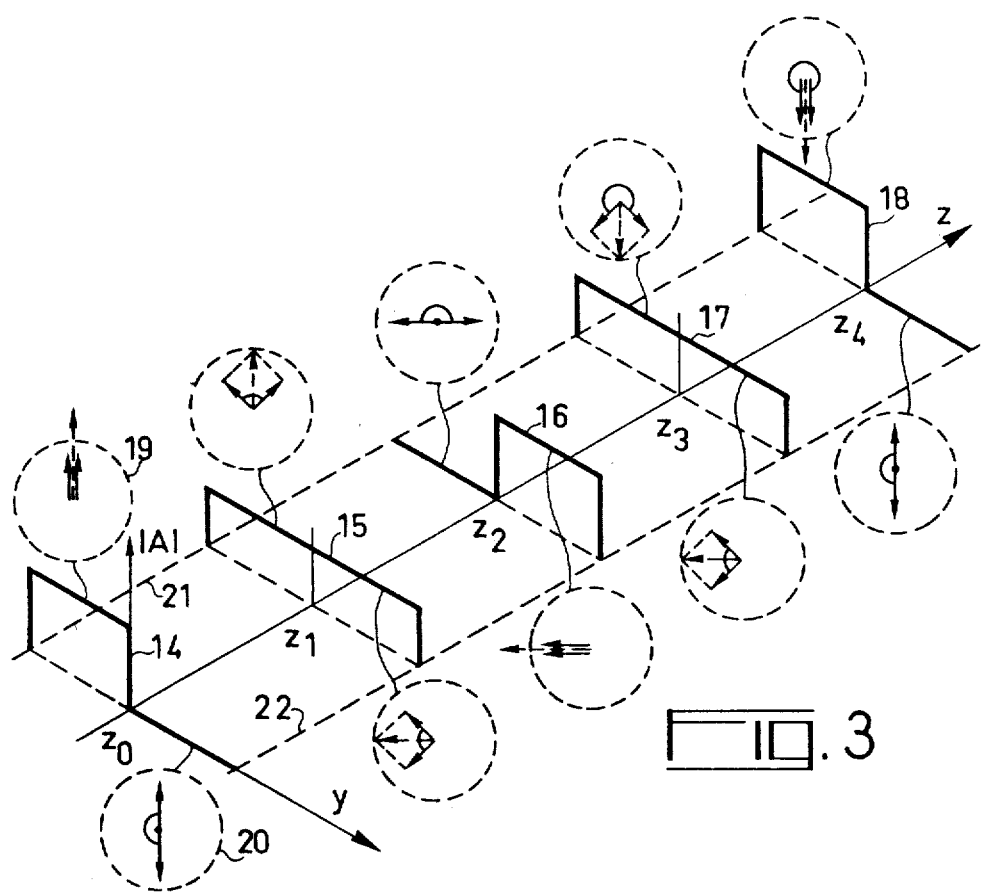
FIG. 3 shows the behavior of a dual-path exchange structure from the double point of view of amplitude distribution and phase relationships which are established along this structure.

In FIG. 3 there are shown the changes undergone by the amplitude distribution in a wave front which is propagated along z through exchange structure C. The incident amplitude distribution 14 corresponds for example to a wave front situated at abscissa $y_o$. It can be seen that the modulus $|A|$ of the amplitude has a constant value in the section of the transmission path between axis z and the broken line 21. On the other hand, modulus $|A|$ has a zero value in the section of the transmission path between axis z and broken line 22.

To illustrate the phase relationships along the wave front, there is shown in FIG. 3 by means of continuous thick lines the symmetrical and anti asymmetrical components having for sum the distribution 14; the vectorial sum is shown by a broken line vector. The phase relationships are surrounded by a broken line circle referenced 19 when it is a question of the transmission path between axis z and line 21 and referenced 20 when it is a question of the transmission path between axis z and line 22.

An examination of FIG. 3 shows that the energy of the incident magnetostatic waves is distributed over the two paths after having traveled the distance $z_o z_1$. At abscissa $z_1$ there is obtained a uniform amplitude distribution 15, but the two paths deliver phase quadrature amplitudes. After further travel over $z_1 z_2$ all the energy of the magnetostatic waves is divided as shown by distribution 16, i.e. that it has passed completely from the left-hand path to the right-hand path. A further travel of $z_2 z_3$ again equalizes the distribution of the energy between the two paths with resultants also in phase quadrature, but in the reverse direction. This is what distribution 17 and the associated phase relationships show. A last distance traveled $z_3z_4$ brings back all the energy into the left-hand path as is shown by amplitude distribution 18. It can be shown that the total transfer of the energy occurs for an exchange structure length equal to:

$$L_o = (\pi/2K)$$

Such an exchange structure forms a total coupler.

An exchange structure having a length equal to $nL_{o/2}$ behaves like a 3 dB coupler if n is an uneven number.

An exchange structure having a length equal to $mL_o$ causes no transfer of energy between the two paths when m is an even number. In this case, there is isomorphism between the distribution of amplitudes of the incident wave front and of the emerging wave front. The smallest distance $L_i$ giving rise to this isomorphism is equal to twice $L_o$.

Generally, any length L redistributes the amplitudes in any ratio with a between-path phase shift of $\pm 90°$.

As a non-limiting example, by adopting the configuration of FIG. 1 an experimental device was constructed having the following characteristics:

Exchange structure C:
Width of metal strips: e = 75 microns
Distance between metal strips: p − e = 75 microns
Length of metal strips: l = 9 mm
Number of metal strips: 20
Transducers $T_1$, $T_2$, $T_3$: width: 30 microns, length: 4 mm.
Ferrimagnetic layer:
  thickness: t = 20 microns, material YIG
  magnetic field applied: $H_o$ = 288 Oersteds
  magnetic moment at saturation: $4\pi$ M = 1750 Oersteds.

Figure 4:
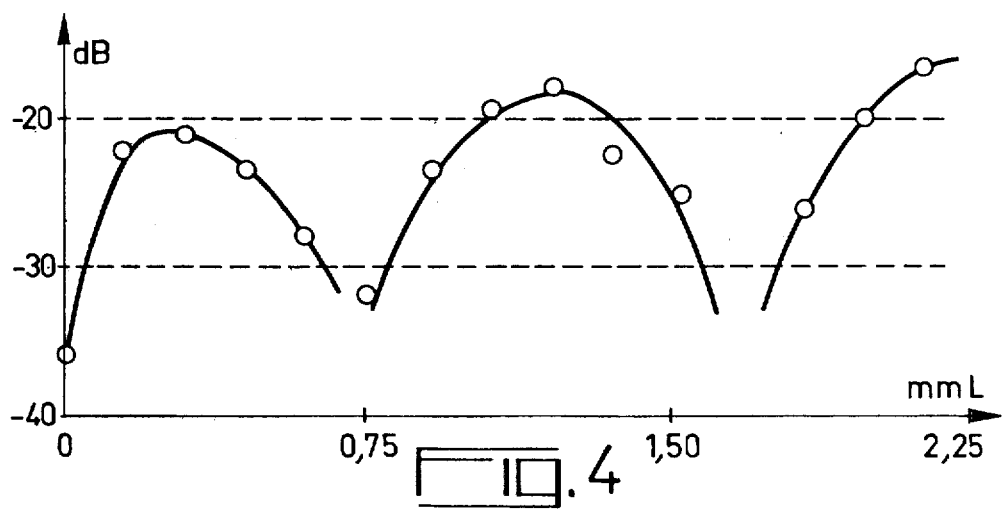
FIG. 4 is an experimental diagram giving the insertion losses with respect to the length of an exchange structure.

The diagram of FIG. 4 has been taken between transducer $T_1$ and transducer $T_3$. It gives at frequency f of 2.45 GHz the insertion losses in decibels with respect to the length L of the exchange structure. The full-line arches illustrate the energy transfers observed; circles represent the measuring points. The variation in length was obtained by removing strips by means of chemical etching.

The following table gives some practical and theoretical indications about the operation of the above-described exchange structure:

| f (GHz) | $L_o$ (μm) | K (experimental) (mm$^{-1}$) | K (theoretical) (mm$^{-1}$) |
|---------|-----------|------------------------------|------------------------------|
| 2.45    | 487       | 3.22                         | 2.41                         |
| 2.50    | 427       | 3.70                         | 2.94                         |
| 2.55    | 375       | 4.19                         | 3.53                         |
| 2.60    | 337       | 4.65                         | 4.17                         |
| 2.65    | 337       | 4.65                         | 4.88                         |
| 2.70    | 319       | 4.93                         | 5.68                         |
| 2.75    | 300       | 5.24                         | 6.00                         |
| 2.80    | 262       | 5.98                         | 7.60                         |

The short-circuited conducting strip exchange structure such as it has just been described finds multiple applications. The simplest consists in providing coupling between two transducers situated on contiguous paths. By omitting in FIG. 1 transducer $T_2$, it can be seen that the whole behaves like a delay line or a filter benefiting from wide-band coupling. In this embodiment, length L is chosen equal to $L_o$ so as to obtain 100% coupling. It may be noted that the band coupler may be formed by a metal deposit effected on surface 3 and delimited by photoetching, but this deposit may also be made for example on a sheet of alumina and the etched face of this plate placed against surface 3.

In FIG. 5 two magnetostatic-wave devices interconnected by means of a total coupler C can be seen. Substrates 23 and 25 are covered with ferrimagnetic layers 24 and 26 equipped respectively with an emitting transducer 27 for emitting magnetostatic waves in direction 29 and a receiving transducer 28 receiving the magnetostatic waves transmitted in direction 30. The surfaces of both layers 24 and 26 are coplanar and contiguous in the region of coupler C. For this reason, the electromagnetic energy flows from input E to the output S via the coupler C.

In FIG. 6 there is shown a magnetostatic-wave device comprising a substrate 23 provided on both its faces with ferrimagnetic layers 24 and 26. Transducer 27 emits magnetostatic waves in direction 29. The coupler C is here a U-shaped structure which passes round the substrate so as to transmit the magnetostatic waves onto the other face where they are propagated in direction 30. A modification of the double-face magnetostatic-wave device is shown with a broken line in FIG. 6. It consists in using another substrate 25 for supporting the ferrimagnetic layer 26. In this case, the lower half of coupler C rests directly on the lower face of substrate 23 and the two devices are stacked so that coupler C effectively couples the surfaces of layers 24 and 26.

In FIG. 7 there can be seen an arrangement in which the ferrimagnetic layers 24 and 26 are supported by substrates 23 and 25 assembled so that the surfaces of the layers form a dihedral angle. With such a configuration, the two halves of coupler C extend over two faces of one of the devices forming a dihedral angle. The two layers 24 and 26 could of course be supported by the same substrate 23 and it could be arranged for coupler C to cover the two layers half and half.

Figure 8:
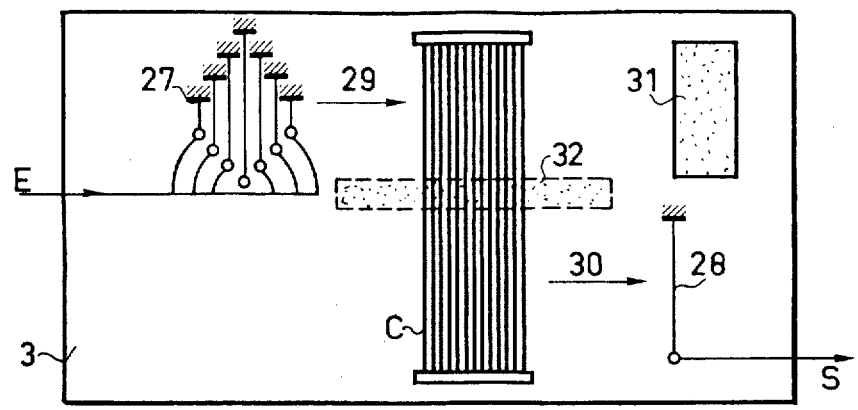
FIG. 8 shows a magnetostatic-wave device comprising a multiple-element element transducer with amplitude weighting.

In FIG. 8 another use of total coupler C can be seen. It is a question here of making uniform the wave fronts radiated by a transducer 27 composed of several elements having unequal lengths. The waves transmitted in direction 30 have an upright wave front compatible with the rectilinear form of the receiving transducer 28. The residue of energy which is not transferred by coupler C may be absorbed by the flecked zone 31. Another flecked zone 32 formed under coupler C prevents the direct radiation between transducer 27 and transducer 28.

Up to here, the conducting strips of coupler C have been rectilinear from one end to the other leaving aside the folds illustrated in FIGS. 6 and 7.

Exchange structures may also be envisaged whose conducting strips are formed from rectilinear portions which are not in the prolongation of each other.

Figure 9:
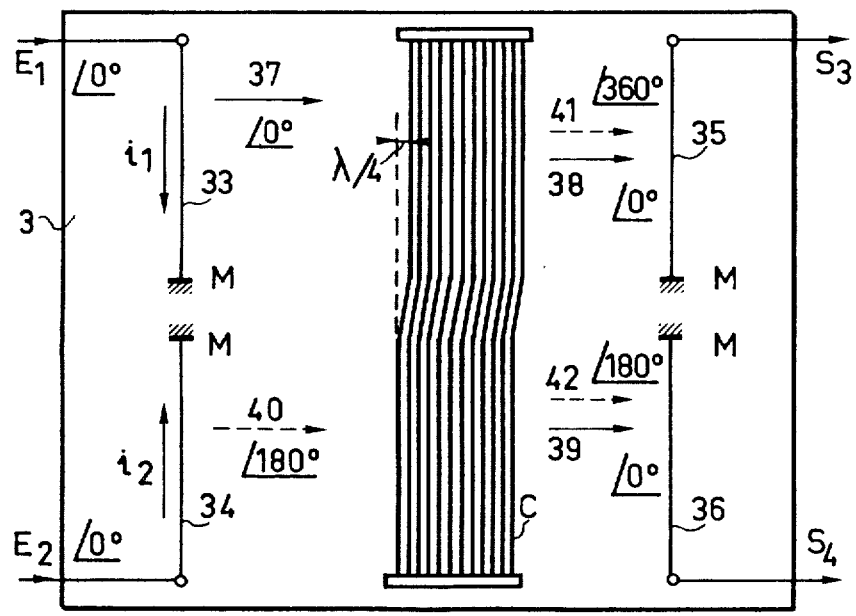
FIG. 9 shows a four-path magnetostatic-wave device forming a hybrid junction.

In FIG. 9 can be seen a hybrid junction further known under the name "magic T" which comprises four transducers 33, 34, 38 and 39 aligned in twos at the surface 3 of a ferrimagnetic layer. The hybrid junction has two input paths $E_1$ and $E_2$ connected respectively to transducers 33 and 34. It also comprises two output paths $S_3$ and $S_4$ to which are respectively connected transducers 35 and 36. Between the input and output transducers is sandwiched an exchange structure C whose strips present in the middle a $\lambda/4$ amplitude displacement, where λ is the operating wavelength of the hybrid junction (it is a question of the wavelength calculated from the properties of the ferrimagnetic layer).

If we assume that the length of the exchange structure C is equal to half length $L_o$, this latter functions like a 3 dB coupler which distributes into two equal parts the electromagnetic energy incident on one of its halves; furthermore, it is known that the amplitudes transmitted in the two output paths are in phase quadrature.

In FIG. 9, it has been assumed that the two input paths $E_1$ and $E_2$ receive signals having the same amplitude and both having a zero phase shift in relation to an appropriate phase reference. These signals cause currents $i_1$ and $i_2$ to flow which cause the emission of magnetostatic waves 37 and 40 which have equal amplitudes and whose phase shifts are respectively $\angle 0°$ and $\angle 180°$. The phase inversion is due to the fact that the grounds M of transducers 33 and 34 are in inside positions. Wave 37 is distributed by coupler C on the basis of a zero phase shift component 38 and a component 39 out of phase by $\angle 0°$. This latter zero phase shift results from the 90° phase advance introduced by coupler C and from the 90° phase lag created by the $\lambda/4$ displacement. Wave 40 is distributed by coupler C on the basis of a component 42 with a phase shift of $\angle 180°$ and a a component 41 out of phase by $\angle 360°$. This latter phase shift results from a 90° phase leading introduced by coupler C and another phase leading created by the $\lambda/4$ displacement. Under these conditions, it can be seen that all the energy is coupled into path $S_3$.

On the other hand, if the input signals are in phase opposition, it can be shown that all the energy is coupled into path $S_4$.

It is indeed a hybrid junction formed essentially by the 3 dB coupler with $\lambda/4$ displacement.

Figure 10:
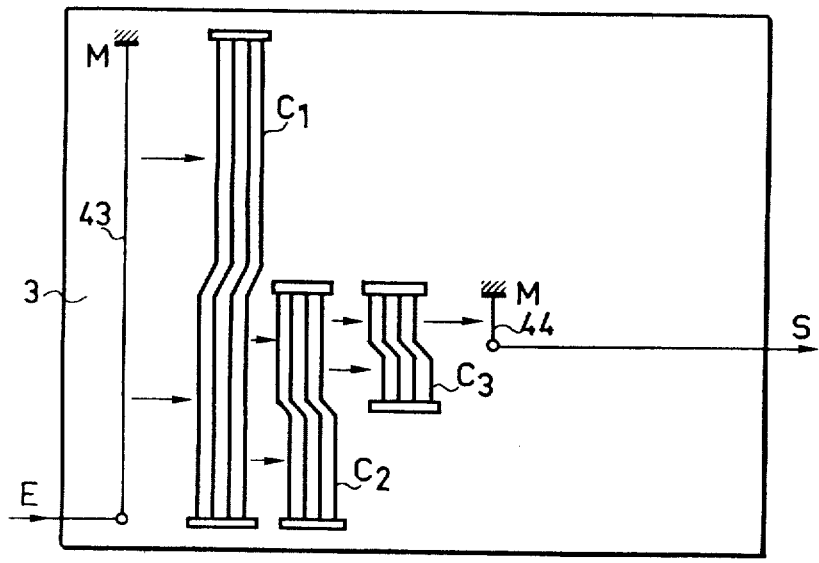
FIG. 10 shows a magnetostatic-wave device for compressing a wave front in width.

In FIG. 10 there can be seen a magnetostatic-wave device for concentrating the electromagnetic energy supplied by an emitting transducer of great length 43. Three hybrid junctions $C_1$, $C_2$ and $C_3$ are disposed in cascade to achieve a concentration equal to $2^3$. The total width of the junctions varies as the numbers 4, 2 and 1. This arrangement permits an incident wave front of width 1 to be converted into a wave front of width $\frac{1}{8}$ with a power-level rise approaching 9 dB.

In what has gone before, the breakdown of amplitudes into symmetrical and anti symmetrical modes is based on incident energization occupying half of the width 1 of the exchange structure. This condition is not limitative, for it may also be assumed that the energization extends over a much greater part of width 1. In this case, a high concentration of the incident magnetostatic waves can be achieved at one and the same time with a single hybrid junction whose displacement value has been adjusted so that the emerging waves can only be added together in the narrowest path.

Figure 11:
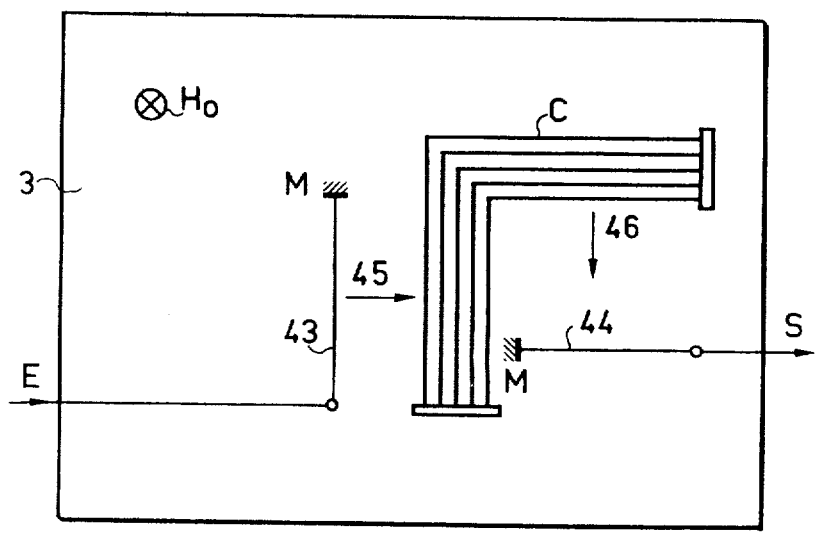
FIG. 11 shows a magnetostatic-wave device for changing the direction of propagation of a wave front.

In FIG. 11 can be seen a magnetostatic-wave device for providing a change in the propagation direction. In the case where the inducing magnetic field $\vec{H}_o$ is oriented perpendicularly to the surface 3 of the ferrimagnetic layer, it is known that this latter can propagate in distinct directions of the so-called bulk forward magnetostatic waves. Such waves are emitted by transducer 43 and are radiated in direction 45. So that they may be received by the receiving transducer 44, FIG. 11 provides an exchange structure C having in surface 3 of the ferrimagnetic layer a 90° bend in the conducting strips. Thus, the emerging waves can take direction 46, which is orthogonal to direction 45. Of course, the angle may take on any desired value. This structure may be obtained in the form of a total coupler of length $L_o$, but it is also possible to choose a different length so as to distribute the incident waves in two distinct directions.

Figure 12:
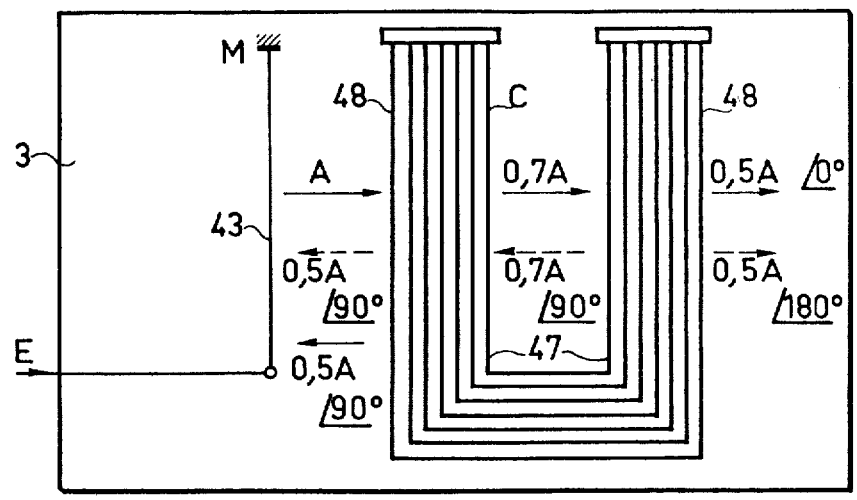
FIGS. 12 and 13 show magnetostatic-wave devices using a U-shaped exchange structure.

In FIG. 12 can be seen a magnetostatic-wave device in which the exchange structure C comprises two successive right-angled bends. This structure is in the form of a U with parallel legs functioning as a wideband mirror when a length $L_{o/2}$ is adopted which divides the incident wave into two equal fractions in phase quadrature. The emitting transducer 43 is normally a bilateral-radiation transducer, but in association with the reflecting structure C, it forms a unilateral-radiation assembly. To understand the operation of the mirror, we must consider the outer conducting strip 48 which receives from transducer 43 an incident wave whose amplitude A presents a zero phase shift with respect to the phase reference. The inner strip 47 of the U-shaped structure radiates towards the right inside the U a wave of amplitude 0.7 A having a zero phase shift and towards the left a wave of amplitude of 0.7 A having a $\angle 90°$ phase shift. The U-shaped structure again subdivides the two waves which travel between its legs into two waves which emerge to the right of the outer strip 48 with amplitudes 0.5 A and phase shifts $\angle 0°$ and $\angle 180°$. These waves are equal and have opposite signs, which cancels out any transmission towards the right. The $\angle 90°$ 0.70 wave which travels between the legs is subdivided into two waves emerging leftwards of the outer strip 48. These two waves have equal amplitudes 0.5 A and phase shifts $\angle 90°$. Thus, the incident wave A is completely reflected with a $\angle 90°$ phase shift. Since coupler C is by construction a wide-band device, the mirror effect is also wideband.

Figure 13:
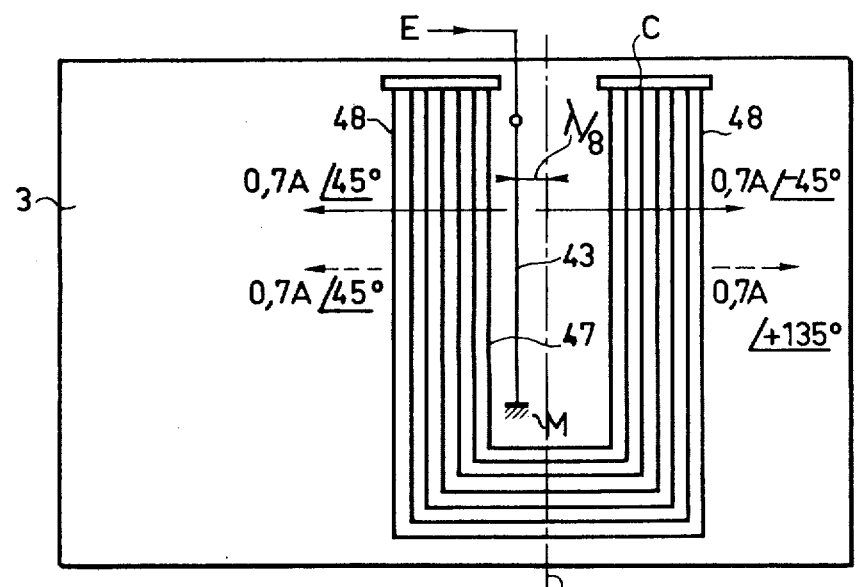

In FIG. 13 can be seen a magnetostatic-wave device which enables unidirectional emission or reception to be obtained with a narrow frequency band. In this variation, transducer 43 is situated between the legs of a U-shaped coupler. The position of transducer 43 is offset by an eighth of a wavelength with respect to the axis of symmetry 49 of the U-shaped coupler. The waves emitted by transducer 43 have amplitudes equal to A when they reach the inner strip 47 of coupler C. One of these waves presents a phase shift of $\angle 45°$ and the other a phase shift of $\angle -45°$. The outer strip 48 of coupler C radiates towards the right two waves of amplitude 0.7 A which have as phase shifts $\angle -45°$ and $\angle +135°$. These waves in phase opposition give a zero resultant. Towards the left, the outer strip 48 of coupler C radiates two waves of amplitude 0.7 A which have the same phase shift $\angle 45°$. There is then finally obtained a resulting wave having an amplitude 1.4 A and consequently a power equal to the sum of the powers radiated inside coupler C by transducer 43.

Figure 14:
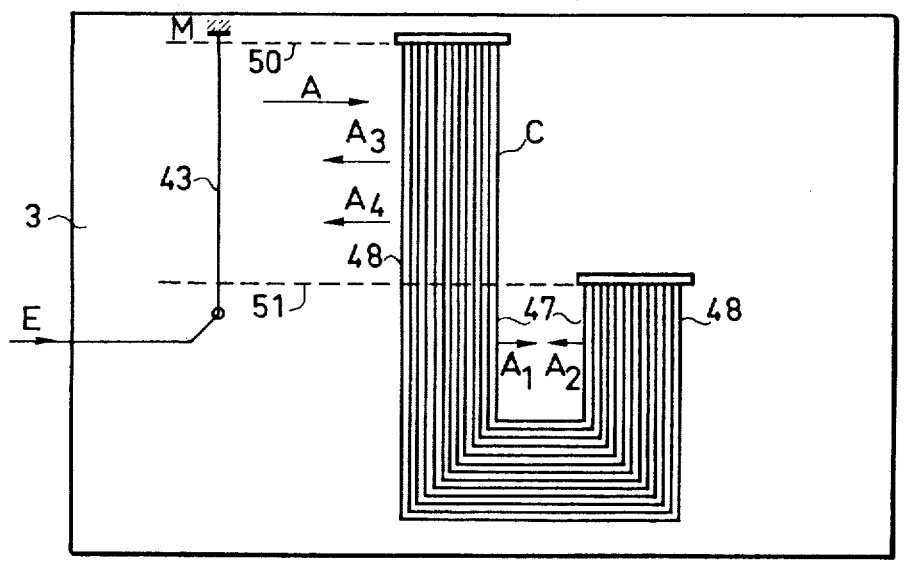
FIGS. 14 and 15 show magnetostatic-wave devices using a J-shaped exchange structure.

In FIG. 14 there can be seen a magnetostatic-wave device using an exchange structure C functioning as a total coupler with two 90° bends and legs of unequal lengths. The right-hand leg of coupler C finishes at the level of a broken line 51 whereas the left-hand leg finishes at the level of a broken line 50. The wave radiated towards the right by transducer 43 has an amplitude A. It is received by the outer strip 48 of coupler C which radiates by its inner strip 47 two contraprogressive waves $A_1$ and $A_2$. These waves are in their turn received by the inner strip 47 and re-emitted by the outer strip 48 in the form of two components having the same direction $A_3$ and $A_4$. This coupler in the form of a J constitutes a reflecting mirror.

Figure 15:
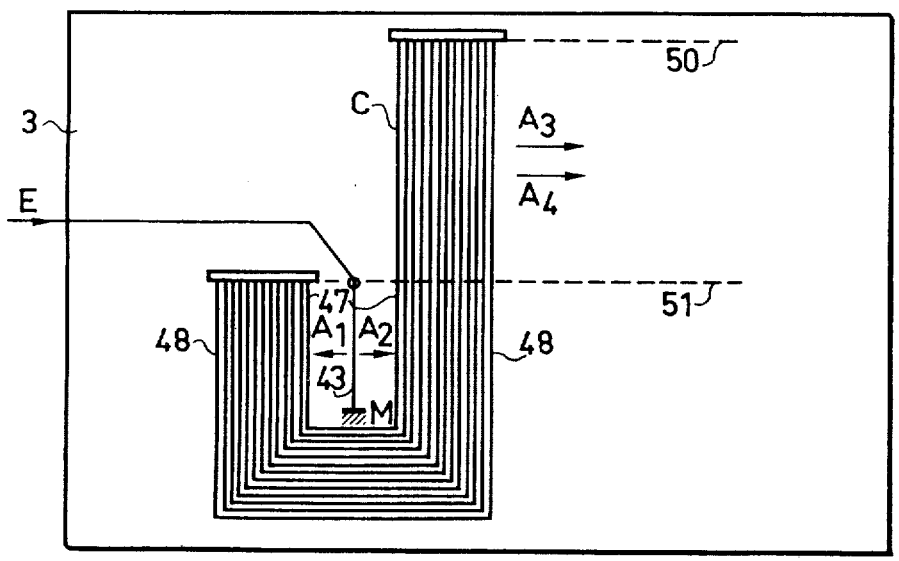

In FIG. 15 can be seen a magnetostatic-wave device using a transducer 43 situated between the legs of a J-shaped coupler C. Transducer 43 is situated equidistant from the two legs. If coupler C is a total coupler of length $L_o$, the waves $A_1$ and $A_2$ radiated by transducer 43 in the direction of the inner strip 47 of the coupler are radiated between lines 50 and 51 in the form of waves $A_3$ and $A_4$ which emerge from the outer strip 48.

When transducer 43 functions as a receiver, a J-shaped coupler of small length may be obtained which, placed between lines 50 and 51, may serve to take off a small fraction of the magnetostatic waves which are propagated between these lines. Such a coupling, whether it is total or partial, is of the wide-band type since transducer 43 is disposed symmetrically between the legs.

Figure 16:
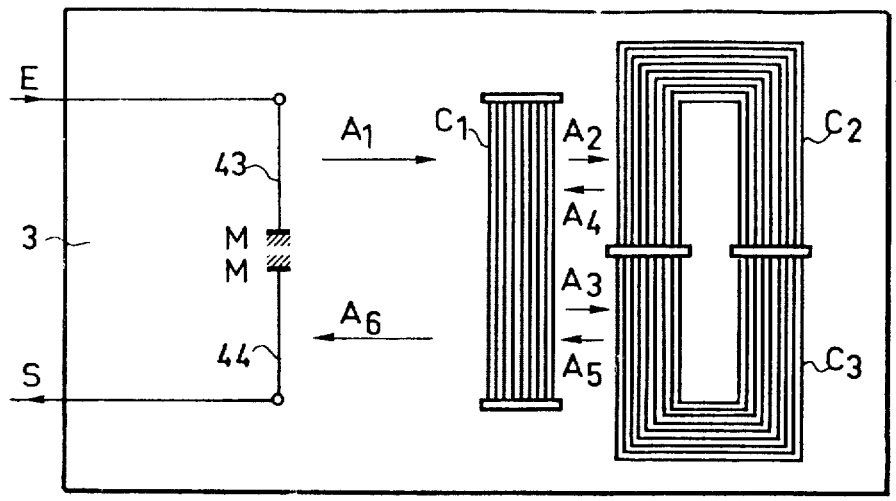
FIG. 16 shows a magnetostatic-wave device comprising a composite reflector.

In FIG. 16 can be seen a magnetostatic-wave device for achieving a change of path with reflection. This device comprises in the upper path an emitting transducer 43 and in the lower path a receiving transducer 44.

A 3 dB coupler $C_1$ extends over the two paths. Two U-shaped couplers $C_2$ and $C_3$ form in each of the two paths a wide-band mirror similar to that of FIG. 12. Wave $A_1$ emitted by transducer 43 is converted by coupler $C_1$ into waves $A_2$ and $A_3$ which in their turn are reflected in the form of waves $A_4$ and $A_5$ by mirrors $C_2$ and $C_3$. The returning waves $A_4$ and $A_5$ received by coupler $C_1$ are converted into a wave $A_5$ which is picked up by transducer 44. The exchange provided by couplers $C_1$, $C_2$ and $C_3$ is of the wide-band type.

Figure 17:
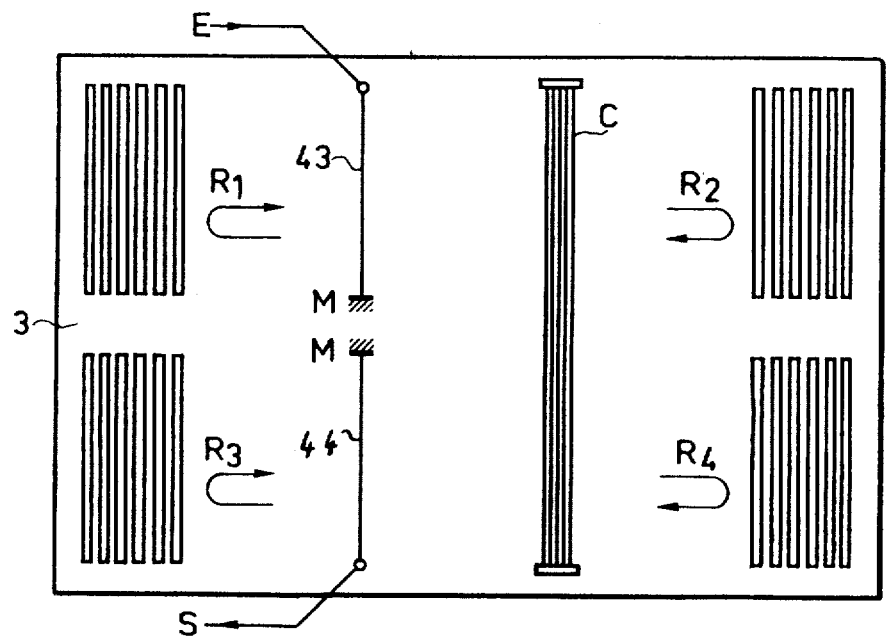
FIG. 17 shows a magnetostatic-wave device comprising two coupled resonators.

In FIG. 17 can be seen a magnetostatic-wave device comprising two coupled resonators. For this, the surface 3 of the ferrimagnetic layer is provided with four reflector networks $R_1$, $R_2$, $R_3$ and $R_4$. Each reflector network is formed for example from equidistant conducting strips whose pitch is selected so as to reflect the magnetostatic waves having a predetermined wavelength. The pitch is then different from that of the conducting strips which form the coupler C and furthermore the strips forming the reflector networks are not connected electrically at their ends. The reflector networks $R_1$ and $R_2$ form a first resonating cavity which contains the emitting transducer 43. The reflector networks $R_3$ and $R_4$ form a second resonating cavity which contains the receiving transducer 44. Coupler C connects the two resonating cavities together. By adjusting the length L of coupler C, the coupling coefficient between the two cavities can be varied. The device of FIG. 17 is advantageous for constructing a tunable oscillator. In this case, input E and output S are connected to the output and to the input of an amplifying circuit. Tuning of the oscillator may be obtained by varying the magnetic field $\vec{H}_o$ applied to the ferrimagnetic layer, but this tuning technique is not limited to the oscillators.

In the embodiment of FIG. 17 it can be seen that the surface 3 of the ferrimagnetic layer has three sorts of elements all formed by conducting strips. All these elements may be formed collectively by covering surface 3 with a metal deposit which is subjected to selective chemical etching, after use of the well-known techniques of photomasking.

Although there has been described above and shown in the drawings, the essential characteristics of the present invention applied to preferred embodiments thereof, modification of form or detail may be made thereto without departing from the scope and spirit of the invention.

What is claimed is:

1. A magnetostatic wave device comprising a layer of ferro-magnetic material subjected to a polarizing magnetic field, means for launching along one of its faces magnetostatic waves, and at least one exchange structure provided on said one face; said structure comprising an array of N adjacent conducting strips having N first ends and N second ends and further comprising conducting means electrically interconnecting said N first ends and said N second ends for causing a current induced by said magnetostatic waves in any one of said N conducting strips to loop inside said exchange structure; the arrangement of said strips being such that they take on the form of the incident wavefronts of said magnetostatic waves over at least a part of their length.

2. The magnetostatic-wave device as claimed in claim 1, wherein said strips are rectilinear over at least a part of their length.

3. The magnetostatic-wave device as claimed in claim 2, wherein the spacing and the pitch of said conducting strips are uniform at least in said rectilinear part.

4. The magnetostatic-wave device as claimed in one of claims 2 and 3, wherein the distance separating the endmost strips of the array in said rectilinear part is less than the smallest interaction distance for which an amplitude distribution of the incident wave front and that of the emerging wave front would be isomorphous.

5. The magnetostatic-wave device as claimed in claim 4, wherein the distance separating the endmost strips of the array is substantially equal to half said interaction distance.

6. The magnetostatic-wave device as claimed in claim 4, wherein the distance separating the endmost strips of the array is substantially equal to n times the quarter of said interaction distance, n being an uneven whole number.

7. The magnetostatic-wave device as claimed in claim 1, wherein said conducting strips rest on two distinct faces along which the magnetostatic waves are capable of being propagated.

8. The magnetostatic-wave device as claimed in claim 7, wherein said faces are contiguous.

9. The magnetostatic-wave device as claimed in claim 7, wherein said faces are superimposed.

10. The magnetostatic-wave device as claimed in claim 1, wherein each of said conducting strips has two rectilinear portions connected together by a bend.

11. The magnetostatic-wave device as claimed in claim 10, wherein said two rectilinear portions are parallel.

12. The magnetostatic-wave device as claimed in claim 10, wherein said two rectilinear portions form an angle less than 180°.

13. The magnetostatic-wave device as claimed in claim 10, wherein said two rectilinear portions are equal so as to form a U-shaped structure.

14. The magnetostatic-wave device as claimed in claim 10, wherein said two rectilinear portions are unequal so as to form a J-shaped structure.

15. The magnetostatic-wave device as claimed in claim 1, wherein each of said conducting strips has two parallel rectilinear portions connected by an oblique portion introducing a displacement of a predetermined value.

16. The magnetostatic-wave device as claimed in claim 13, wherein there is furthermore provided a transducer situated inside the U-shaped structure; this transducer being offset with respect to the axis of symmetry of the legs of the U-shaped structure.

17. The magnetostatic-wave device as claimed in claim 14, wherein there is further provided a transducer disposed symmetrically between the legs of the J-shaped structure.

18. The magnetostatic-wave device as claimed in claim 15, wherein said two rectilinear portions are equal.

19. The magnetostatic-wave device as claimed in claim 18, wherein there is further provided several exchange structures arranged in cascade and each formed by conducting strips having two equal and parallel rectilinear portions connected by an oblique portion presenting a displacement of a predetermined value; the lengths of said rectilinear portions varying from one exchange structure to the next in a geometric progression with a common ratio equal to two.

20. The magnetostatic-wave device as claimed in claim 13, wherein two U-shaped structures and a rectilinear-strip exchange structure are provided; the rectilinear legs of said U-shaped structures being aligned and arranged so as to receive magnetostatic waves coming from the rectilinear strips of the exchange structure.

21. The magnetostatic-wave device as claimed in claim 1, wherein two network resonators are provided; the exchange structure penetrating inside these resonators so as to provide coupling between the stationary waves which are formed inside the resonators.

22. The magnetostatic-wave device as claimed in claim 1, wherein said exchange structure is associated with at least one transducer comprising several parallel radiating elements of unequal lengths.

23. The magnetostatic-wave device as claimed in claim 1, wherein said exchange structure is a cut-out in a metal film placed in contact with the layer of ferrimagnetic material.

24. The magnetostatic-wave device as claimed in claim 1, wherein said exchange structure is a cut-out in a metal structure are further connected together by a ground conductor surrounding the elements supporting the exchange structure.

25. The magnetostatic-wave device as claimed in claim 15, wherein said rectilinear portions are of unequal lengths.

* * * * *